US011231871B2

(12) United States Patent
Masuda

(10) Patent No.: US 11,231,871 B2
(45) Date of Patent: Jan. 25, 2022

(54) ELECTRONIC CONTROL DEVICE WITH NON-VOLATILE MEMORY

(71) Applicant: HITACHI AUTOMOTIVE SYSTEMS, LTD., Hitachinaka (JP)

(72) Inventor: Kenji Masuda, Hitachinaka (JP)

(73) Assignee: HITACHI AUTOMOTIVE SYSTEMS, LTD., Ibaraki (JP)

( * ) Notice: Subject to any disclaimer, the term of this patent is extended or adjusted under 35 U.S.C. 154(b) by 0 days.

(21) Appl. No.: 16/772,289

(22) PCT Filed: Feb. 1, 2019

(86) PCT No.: PCT/JP2019/003567
§ 371 (c)(1),
(2) Date: Jun. 12, 2020

(87) PCT Pub. No.: WO2019/159716
PCT Pub. Date: Aug. 22, 2019

(65) Prior Publication Data
US 2021/0072919 A1 Mar. 11, 2021

(30) Foreign Application Priority Data

Feb. 14, 2018 (JP) .............................. JP2018-024129

(51) Int. Cl.
*G06F 3/06* (2006.01)
(52) U.S. Cl.
CPC .......... *G06F 3/0655* (2013.01); *G06F 3/0604* (2013.01); *G06F 3/0679* (2013.01)
(58) Field of Classification Search
None
See application file for complete search history.

(56) References Cited

U.S. PATENT DOCUMENTS

| | | | |
|---|---|---|---|
| 6,813,678 B1 * | 11/2004 | Sinclair | ................. G06F 3/0626 |
| | | | 711/103 |
| 8,849,504 B2 | 9/2014 | Watanabe | |
| 2019/0088350 A1 * | 3/2019 | Matsumoto | ............ G11C 16/22 |

FOREIGN PATENT DOCUMENTS

| | | |
|---|---|---|
| JP | 2004-118937 A | 4/2004 |
| JP | 2009-289049 A | 12/2009 |
| JP | 2015-176177 A | 10/2015 |

OTHER PUBLICATIONS

Extended European Search Report dated Oct. 8, 2021 for European Patent Application No. 19754011.5.

\* cited by examiner

*Primary Examiner* — Jane Wei
(74) *Attorney, Agent, or Firm* — Volpe Koenig

(57) ABSTRACT

The present invention detects a battery abnormality during a driving cycle or self-shutdown even when a battery voltage sensor is not mounted. In the present invention, a first storage region is provided with a failure information storage region and a second storage region management information storage region, a second storage region is provided with a failure information storage region and a first storage region management information storage region, and a management information access flag storage region for storing access information indicating a presence or absence of an access to management information of the first storage region and management information of the second storage region is provided separately from the first storage region and the second storage region.

9 Claims, 12 Drawing Sheets

Fig. 11

| ACCESS FLAG | | READ BLOCK | | WRITE BLOCK | | BATTERY DISCONNECTION TIMING | ABNORMALITY DETECTION PATTERN | ABNORMALITY DETECTION CONTENT |
|---|---|---|---|---|---|---|---|---|
| START MARK SIDE | COMPLETION MARK SIDE | START MARK | COMPLETION MARK | START MARK | COMPLETION MARK | | | |
| PRESENT | ABSENT | BLANK | BLANK | NOT INDEFINITE | NOT INDEFINITE | NORMAL DC | PATTERN 1 | BATTERY DISCONNECTION ABNORMALITY+READABLE REGION SIDE ELEMENT ABNORMALITY |
| PRESENT | ABSENT | BLANK | BLANK | INDEFINITE | INDEFINITE | DURING SHUTDOWN | PATTERN 2 | BATTERY DISCONNECTION ABNORMALITY+READABLE REGION SIDE ELEMENT ABNORMALITY |
| PRESENT | ABSENT | BLANK | NORMAL | NOT INDEFINITE | NOT INDEFINITE | NORMAL DC | PATTERN 1 | BATTERY DISCONNECTION ABNORMALITY+READABLE REGION SIDE ELEMENT ABNORMALITY |
| PRESENT | ABSENT | BLANK | NORMAL | INDEFINITE | INDEFINITE | DURING SHUTDOWN | PATTERN 2 | BATTERY DISCONNECTION ABNORMALITY+READABLE REGION SIDE ELEMENT ABNORMALITY |
| PRESENT | ABSENT | BLANK | ABNORMAL | NOT INDEFINITE | NOT INDEFINITE | NORMAL DC | PATTERN 1 | BATTERY DISCONNECTION ABNORMALITY+READABLE REGION SIDE ELEMENT ABNORMALITY |
| PRESENT | ABSENT | BLANK | ABNORMAL | INDEFINITE | INDEFINITE | DURING SHUTDOWN | PATTERN 2 | BATTERY DISCONNECTION ABNORMALITY+READABLE REGION SIDE ELEMENT ABNORMALITY |
| PRESENT | ABSENT | NORMAL | BLANK | NOT INDEFINITE | NOT INDEFINITE | NORMAL DC | PATTERN 3 | BATTERY DISCONNECTION ABNORMALITY DURING DRIVING CYCLE |
| PRESENT | ABSENT | NORMAL | BLANK | INDEFINITE | INDEFINITE | DURING SHUTDOWN | PATTERN 4 | BATTERY DISCONNECTION ABNORMALITY DURING SHUTDOWN |
| PRESENT | ABSENT | NORMAL | NORMAL | NOT INDEFINITE | NOT INDEFINITE | NORMAL DC | PATTERN 1 | BATTERY DISCONNECTION ABNORMALITY+READABLE REGION SIDE ELEMENT ABNORMALITY |
| PRESENT | ABSENT | NORMAL | NORMAL | INDEFINITE | INDEFINITE | DURING SHUTDOWN | PATTERN 2 | BATTERY DISCONNECTION ABNORMALITY+READABLE REGION SIDE ELEMENT ABNORMALITY |
| PRESENT | ABSENT | NORMAL | ABNORMAL | NOT INDEFINITE | NOT INDEFINITE | NORMAL DC | PATTERN 1 | BATTERY DISCONNECTION ABNORMALITY+READABLE REGION SIDE ELEMENT ABNORMALITY |
| PRESENT | ABSENT | NORMAL | ABNORMAL | INDEFINITE | INDEFINITE | DURING SHUTDOWN | PATTERN 2 | BATTERY DISCONNECTION ABNORMALITY+READABLE REGION SIDE ELEMENT ABNORMALITY |
| PRESENT | ABSENT | ABNORMAL | BLANK | NOT INDEFINITE | NOT INDEFINITE | NORMAL DC | PATTERN 1 | BATTERY DISCONNECTION ABNORMALITY+READABLE REGION SIDE ELEMENT ABNORMALITY |
| PRESENT | ABSENT | ABNORMAL | BLANK | INDEFINITE | INDEFINITE | DURING SHUTDOWN | PATTERN 2 | BATTERY DISCONNECTION ABNORMALITY+READABLE REGION SIDE ELEMENT ABNORMALITY |
| PRESENT | ABSENT | ABNORMAL | NORMAL | NOT INDEFINITE | NOT INDEFINITE | NORMAL DC | PATTERN 1 | BATTERY DISCONNECTION ABNORMALITY+READABLE REGION SIDE ELEMENT ABNORMALITY |
| PRESENT | ABSENT | ABNORMAL | NORMAL | INDEFINITE | INDEFINITE | DURING SHUTDOWN | PATTERN 2 | BATTERY DISCONNECTION ABNORMALITY+READABLE REGION SIDE ELEMENT ABNORMALITY |
| PRESENT | ABSENT | ABNORMAL | ABNORMAL | NOT INDEFINITE | NOT INDEFINITE | NORMAL DC | PATTERN 1 | BATTERY DISCONNECTION ABNORMALITY+READABLE REGION SIDE ELEMENT ABNORMALITY |
| PRESENT | ABSENT | ABNORMAL | ABNORMAL | INDEFINITE | INDEFINITE | DURING SHUTDOWN | PATTERN 2 | BATTERY DISCONNECTION ABNORMALITY+READABLE REGION SIDE ELEMENT ABNORMALITY |
| PRESENT | PRESENT | BLANK | BLANK | BLANK | BLANK | | PATTERN 5 | WRITABLE REGION SIDE ELEMENT ABNORMALITY(*1) |
| PRESENT | PRESENT | BLANK | BLANK | BLANK | NORMAL | | PATTERN 5 | WRITABLE REGION SIDE ELEMENT ABNORMALITY(*1) |
| PRESENT | PRESENT | BLANK | BLANK | BLANK | ABNORMAL | | PATTERN 5 | WRITABLE REGION SIDE ELEMENT ABNORMALITY(*1) |
| PRESENT | PRESENT | BLANK | BLANK | NORMAL | BLANK | | PATTERN 5 | WRITABLE REGION SIDE ELEMENT ABNORMALITY(*1) |
| PRESENT | PRESENT | BLANK | BLANK | NORMAL | NORMAL | | PATTERN 6 | STORAGE REGION 1:2 NORMAL |
| PRESENT | PRESENT | BLANK | BLANK | NORMAL | ABNORMAL | | PATTERN 5 | WRITABLE REGION SIDE ELEMENT ABNORMALITY(*1) |
| PRESENT | PRESENT | BLANK | BLANK | ABNORMAL | BLANK | | PATTERN 5 | WRITABLE REGION SIDE ELEMENT ABNORMALITY(*1) |
| PRESENT | PRESENT | BLANK | BLANK | ABNORMAL | NORMAL | | PATTERN 5 | WRITABLE REGION SIDE ELEMENT ABNORMALITY(*1) |
| PRESENT | PRESENT | BLANK | BLANK | ABNORMAL | ABNORMAL | | PATTERN 5 | WRITABLE REGION SIDE ELEMENT ABNORMALITY(*1) |
| PRESENT | PRESENT | BLANK | NORMAL | | | | | EXCLUDED(*2) |
| PRESENT | PRESENT | BLANK | ABNORMAL | | | | | EXCLUDED(*2) |
| PRESENT | PRESENT | NORMAL | BLANK | | | | | EXCLUDED(*2) |
| PRESENT | PRESENT | NORMAL | NORMAL | | | | | EXCLUDED(*2) |
| PRESENT | PRESENT | NORMAL | ABNORMAL | | | | | EXCLUDED(*2) |
| PRESENT | PRESENT | ABNORMAL | BLANK | | | | | EXCLUDED(*2) |
| PRESENT | PRESENT | ABNORMAL | NORMAL | | | | | EXCLUDED(*2) |
| PRESENT | PRESENT | ABNORMAL | ABNORMAL | | | | | EXCLUDED(*2) |

*1···EXCLUDED BECAUSE THIS CONTROL IS BATTERY DISCONNECTION ABNORMALITY DIAGNOSIS DEVICE USING MEMORY BACKUP CONTROL
*2···EXCLUDED FROM CHECK BECAUSE IT IS IMPOSSIBLE CASE IN CONVENTIONAL AUTOMOBILE BACKUP CONTROL [MEMORY ERASURE CHECK PROCESSING]
NOT INDEFINITE···CASE WHERE EITHER ERASURE START MARK, WRITE COMPLETION MARK, OR BLANK IS RECORDED
INDEFINITE···CASE WHERE NEITHER ERASURE START MARK, WRITE COMPLETION MARK, NOR BLANK IS RECORDED

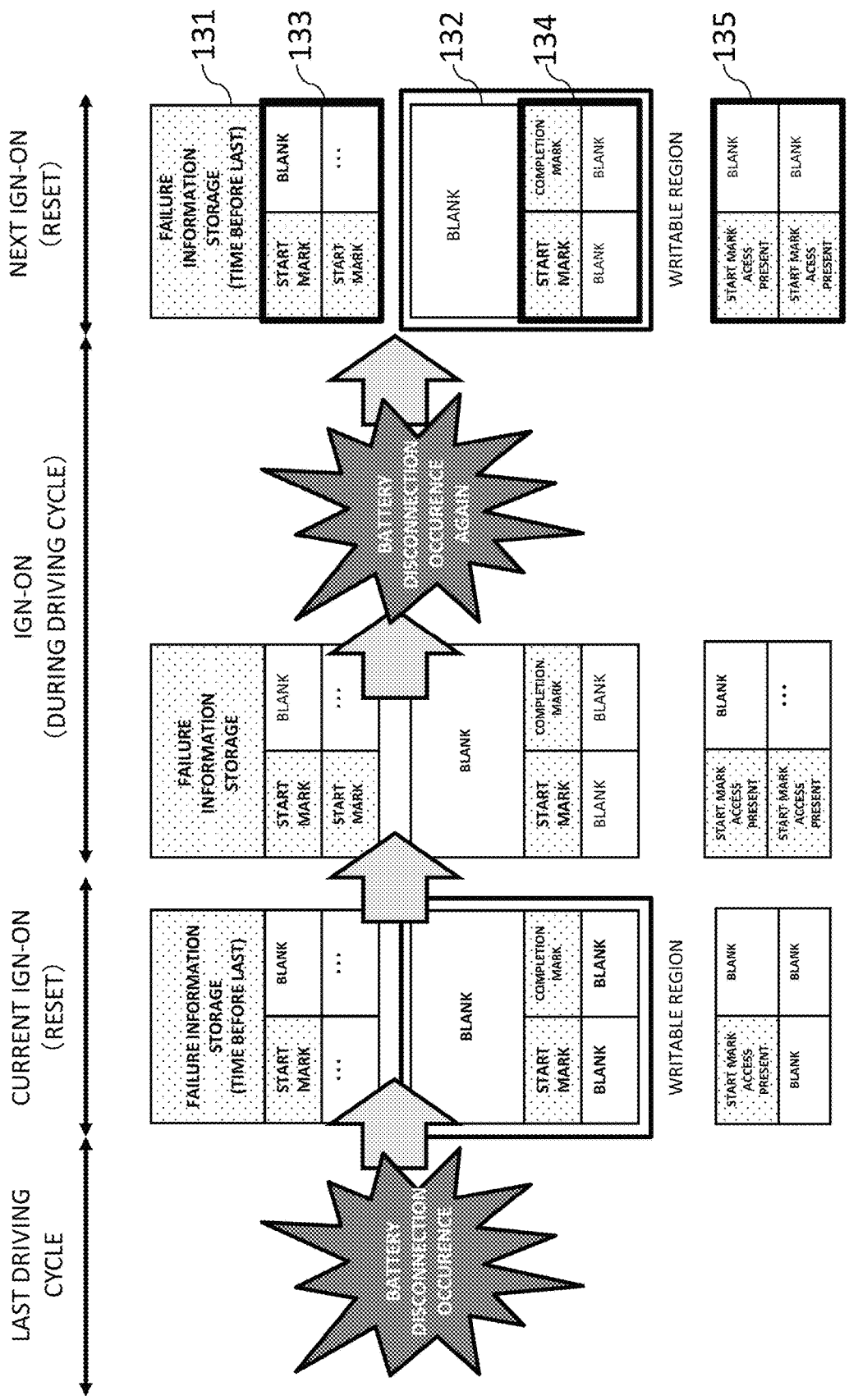

ELECTRONIC CONTROL DEVICE WITH NON-VOLATILE MEMORY

TECHNICAL FIELD

The present invention relates to an electronic control device applicable to a vehicle.

BACKGROUND ART

With the recent increasing computerization of the environment surrounding vehicles, control has become more complicated and sophisticated in accordance with demands from the market for drivability, fuel efficiency, comfort, and the like, and the risk of failures and malfunctions inherent in vehicles has increased. In particular, with regard to fuel efficiency, partly due to an influence of the revision of on-board diagnostics (OBD) regulations and the like, there is a movement to increase the number of devices constituting a vehicle and to subdivide the diagnosis results of each device constituting a system so as to be capable of detecting in more detail whether it is an abnormal state or a normal state.

In most cases, the device diagnosis control determines whether the state of the device during a driving cycle is normal or abnormal on the basis of input from hardware such as a vehicle speed sensor or a hydraulic sensor.

Here, on an assumption that the sensor of a diagnosis target device is already mounted on the controller unit, the diagnosis control can be implemented only by developing control software. For this reason, the subdivision of the diagnosis method can be performed only by changing the software, and it is not relatively difficult to shorten the control development period.

However, since the subdivision of the diagnosis method is a legal compliance, it is not necessarily limited to a system equipped with a sensor of a diagnosis target device. If the sensor of the diagnosis target device is not mounted, it is necessary to change not only the software of the controller unit but also the hardware configuration.

For this reason, in terms of hardware, an enormous amount of development man-hours may be required for selection and evaluation tests of a mounted sensor and the like. Furthermore, in terms of software, it is necessary to newly design and examine the diagnosis control logic, which may make it very difficult to shorten the control development period.

On the other hand, a vehicle electronic control device is equipped with a memory backup function that writes information such as a learning value and failure information into a nonvolatile memory capable of electrically erasing and writing recorded contents at any timing or during self-shutdown.

However, memory backup may not be normally performed due to, for example, an abnormality in a memory element or a drop in battery voltage.

PTL 1 discloses a vehicle electronic control device which stores management information such as a write start mark and a write completion mark to detect a memory backup abnormality caused by a battery voltage drop and effectively utilize a normal memory region as much as possible.

CITATION LIST

Patent Literature

PTL 1: JP 2015-176177 A

SUMMARY OF INVENTION

Technical Problem

However, in the technique disclosed in PTL 1, from a point of view of the battery voltage abnormality, the abnormality detection target range is only during self-shutdown at the time of terminating the driving cycle. For this reason, if a battery voltage drop, disconnection, or the like occurs during the driving cycle, the abnormality may not be detected correctly.

Furthermore, the input information of abnormality detection is only one type of management information of a write start mark and a completion mark which are write management information. For this reason, if a memory element (memory cell) fails in a storage region of the management information and a memory element abnormality occurs, there is a possibility of causing erroneous detection.

The present invention has been made in view of the above circumstances, and its object is to provide an electronic control device capable of detecting a battery abnormality during a driving cycle or self-shutdown even when a battery voltage sensor is not mounted.

Solution to Problem

In order to achieve the above object, an electronic control device according to a first aspect is an electronic control device including a nonvolatile memory including a plurality of storage regions, in which the storage regions include an information storage region for storing information and a management information storage region for storing management information indicating a write state of information to the storage regions, and the nonvolatile memory includes, separately from the storage regions, a management information access flag storage region for storing access information indicating a presence or absence of an access to the management information.

Advantageous Effects of Invention

According to the present invention, it is possible to detect a battery abnormality during a driving cycle or self-shutdown even when a battery voltage sensor is not mounted.

BRIEF DESCRIPTION OF DRAWINGS

FIG. 11 is a table presenting an abnormality detection pattern of management information determination processing in the electronic control device according to the embodiment.

FIG. 12 is a diagram illustrating the failure information writing processing at the time when a battery disconnection abnormality has continuously occurred during a driving cycle of the electronic control device according to the embodiment.

DESCRIPTION OF EMBODIMENTS

An embodiment will be described with reference to the drawings. It should be noted that the embodiment described below does not limit the invention according to claims, and not all of the elements and combinations thereof described in the embodiment are essential to the solution of the invention.

Figure 1:
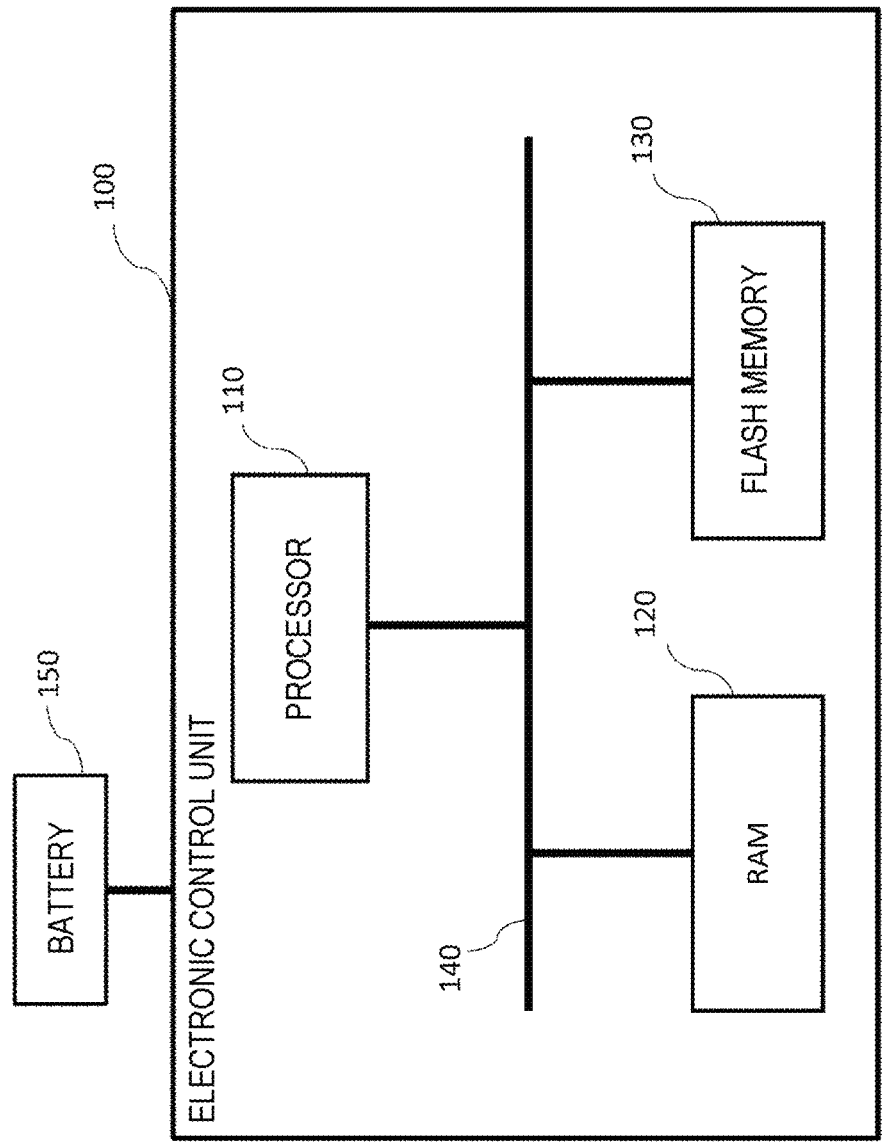
FIG. 1 is a block diagram illustrating a hardware configuration of an electronic control device according to an embodiment.

FIG. 1 is a block diagram illustrating the hardware configuration of the electronic control device according to the embodiment.

In FIG. 1, an electronic control device 100 is provided with a processor 110, a random access memory (RAM) 120, and a flash memory 130.

The processor 110, the RAM 120, and the flash memory 130 are interconnected via a bus 140. Electric power is supplied from a battery 150 to the electronic control device 100.

The electronic control device 100 is a device that electronically controls, for example, an engine, an automatic transmission, and a fuel pump. The processor 110 is hardware controlling the operation of the entire electronic control device 100, and a central processing unit (CPU) or the like may be used. The RAM 120 is a volatile memory that can be provided with a work area for the processor 110 to execute a program. The flash memory 130 is a nonvolatile semiconductor memory such as a flash read only memory (ROM) in which data is not erased even when power supply is cut off. The flash memory 130 stores, for example, various control programs, learning values, failure information by OBD function, and the like. The electronic control device 100 can collect failure information by input from hardware such as a vehicle speed sensor and a hydraulic sensor.

Figure 2:
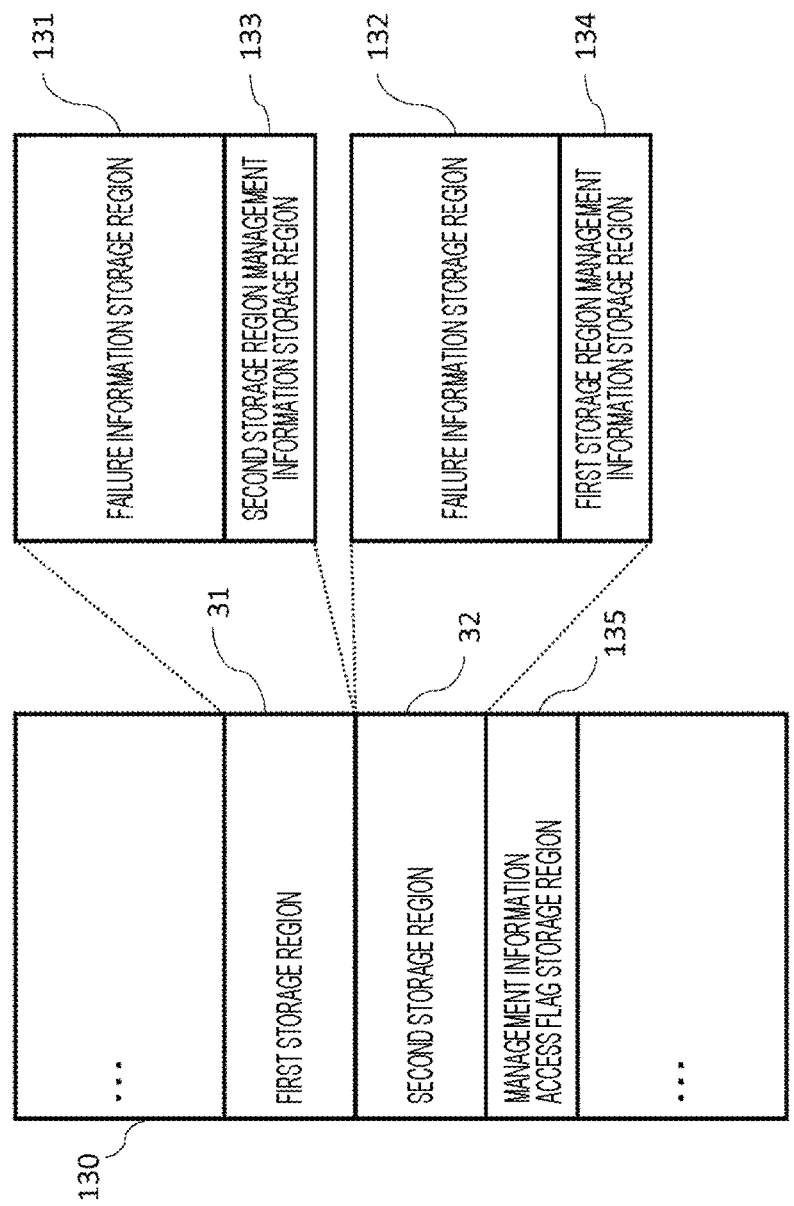
FIG. 2 is a diagram illustrating a data structure of a flash memory of FIG. 1.

FIG. 2 is a diagram illustrating the data structure of the flash memory of FIG. 1.

In FIG. 2, the flash memory 130 is provided with a first storage region 31 and a second storage region 32 as a plurality of storage regions for storing information such as learning values and failure information (hereinafter referred to as failure information). This storage region can be provided in units of erasure of the flash memory 130. When the flash memory 130 is a NAND flash memory, this storage region can be provided in block units. Although FIG. 2 illustrates a case where two storage regions for storing failure information are provided, three or more storage regions for storing failure information may be provided.

The first storage region 31 is provided with a failure information storage region 131 and a second storage region management information storage region 133. The second storage region 32 is provided with a failure information storage region 132 and a first storage region management information storage region 134. The failure information storage region 131 and the failure information storage region 132 store failure information. The second storage region management information storage region 133 stores management information indicating a write state of failure information to the second storage region 32. The first storage region management information storage region 134 stores management information indicating a write state of failure information to the first storage region 31. At this time, the first storage region 31 stores management information for the failure information held in the second storage region 32, and the second storage region 32 stores management information for the failure information held in the first storage region 31. That is, the first storage region 31 and the second storage region 32 hold management information of each other.

Here, when even a part of the data in the first storage region 31 is erased, the entire data stored in the first storage region 31 is erased collectively. Similarly, when even a part of the data in the second storage region 32 is erased, the entire data stored in the second storage region 32 is erased collectively. Therefore, since the first storage region 31 and the second storage region 32 hold management information of each other, even when data in either one of the first storage region 31 and the second storage region 32 is erased, management information of the storage region of the erased side can be left in the storage region of the other side.

Furthermore, the flash memory 130 is provided with a management information access flag storage region 135 for storing access information indicating a presence or absence of access to the management information of the first storage region 31 and the management information of the second storage region 32. The management information access flag storage region 135 is provided separately from the first storage region 31 and the second storage region 32. The management information access flag storage region 135 can be used to detect a battery disconnection at the time of a flash memory element abnormality in which management information is not normally written despite an access to the management information.

Figure 3:
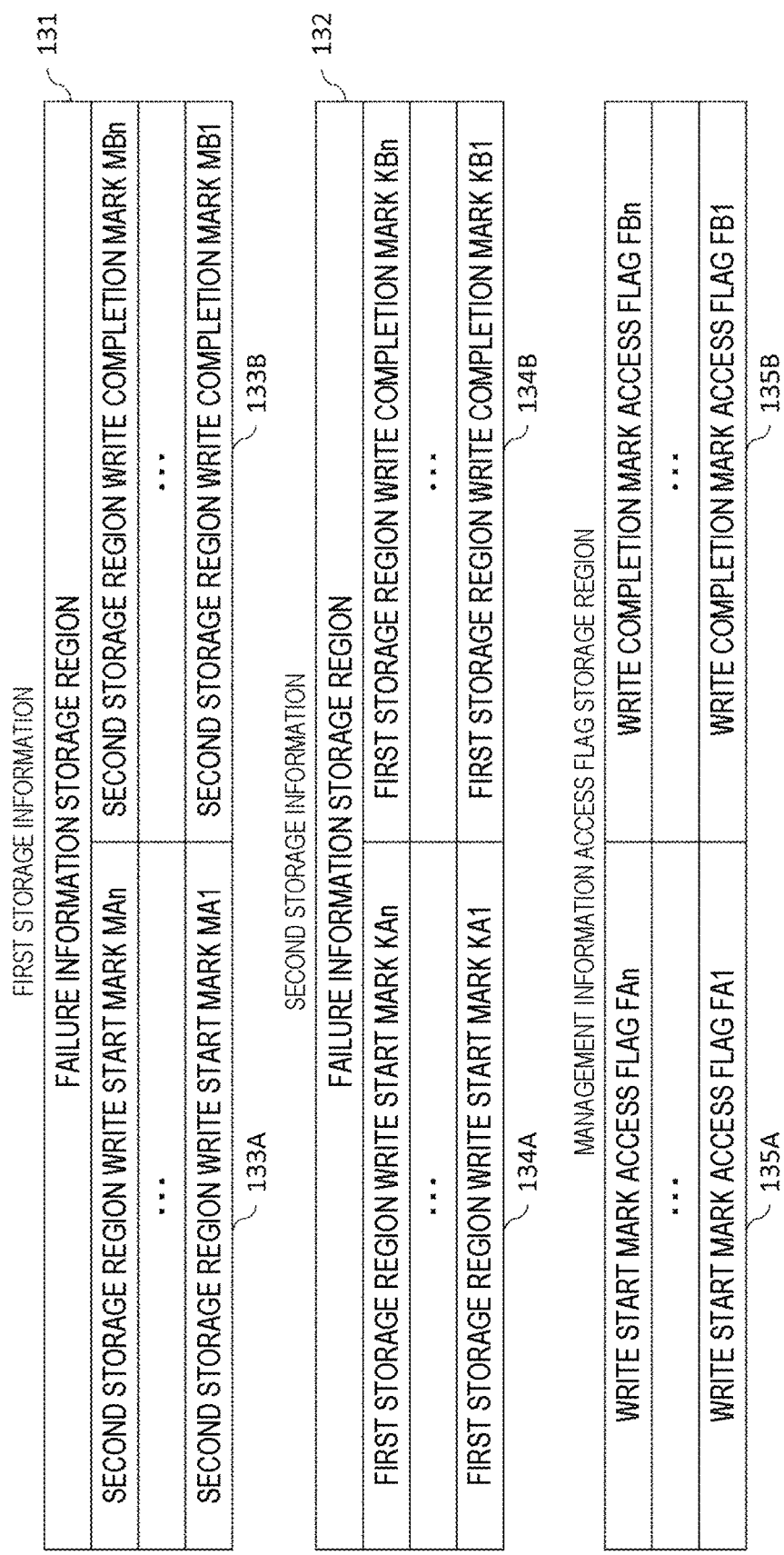
FIG. 3 is a diagram illustrating a configuration of a first storage region management information storage region, a second storage region management information storage region, and a management information access flag storage region of FIG. 2.

FIG. 3 is a diagram illustrating a configuration of the first storage region management information storage region, the second storage region management information storage region, and the management information access flag storage region of FIG. 2.

In FIG. 3, the second storage region management information storage region 133 holds a second storage region write start mark 133A and a second storage region write completion mark 133B as management information of the second storage region 32. The second storage region write start mark 133A indicates the start of writing the failure information to the second storage region 32. The second storage region write completion mark 133B indicates the completion of writing the failure information to the second storage region 32. The second storage region write start mark 133A can be provided with n (n is a positive integer) second storage region write start marks MA1 to MAn. The second storage region write completion mark 133B can be provided with n second storage region write completion marks MB1 to MBn.

The first storage region management information storage region 134 holds a first storage region write start mark 134A and a first storage region write completion mark 134B as management information of the first storage region 31. The first storage region write start mark 134A indicates the start of writing the failure information to the first storage region 31. The first storage region write completion mark 134B indicates the completion of writing the failure information to the first storage region 31. The first storage region write start mark 134A can be provided with n first storage region write start marks KA1 to KAn. The first storage region write completion mark 134B can be provided with n first storage region write completion marks KB1 to KBn.

The management information access flag storage region 135 holds a write start mark access flag 135A and a write completion mark access flag 135B as access information to the management information. The write start mark access flag 135A indicates a presence or absence of access to a registration address of the first storage region write start mark 134A or a registration address of the second storage region write start mark 133A. The write completion mark access flag 135B indicates a presence or absence of access to a registration address of the first storage region write completion mark 134B or a registration address of the second storage region write completion mark 133B. The write start mark access flag 135A can be provided with n write start mark access flags FA1 to FAn. The write completion mark access flag 135B can be provided with n write completion mark access flags FB1 to FBn.

If three or more storage regions are secured in the flash memory 130, management information of other storage regions may be stored in the management information storage region of each storage region so as to have management information of all the storage regions.

In the electronic control device 100 configured as described above, the processor 110 can execute failure information writing processing and failure information reading processing in accordance with a control program that implements an operating system (OS) control function and an application (APPLI) control function.

Figure 4:
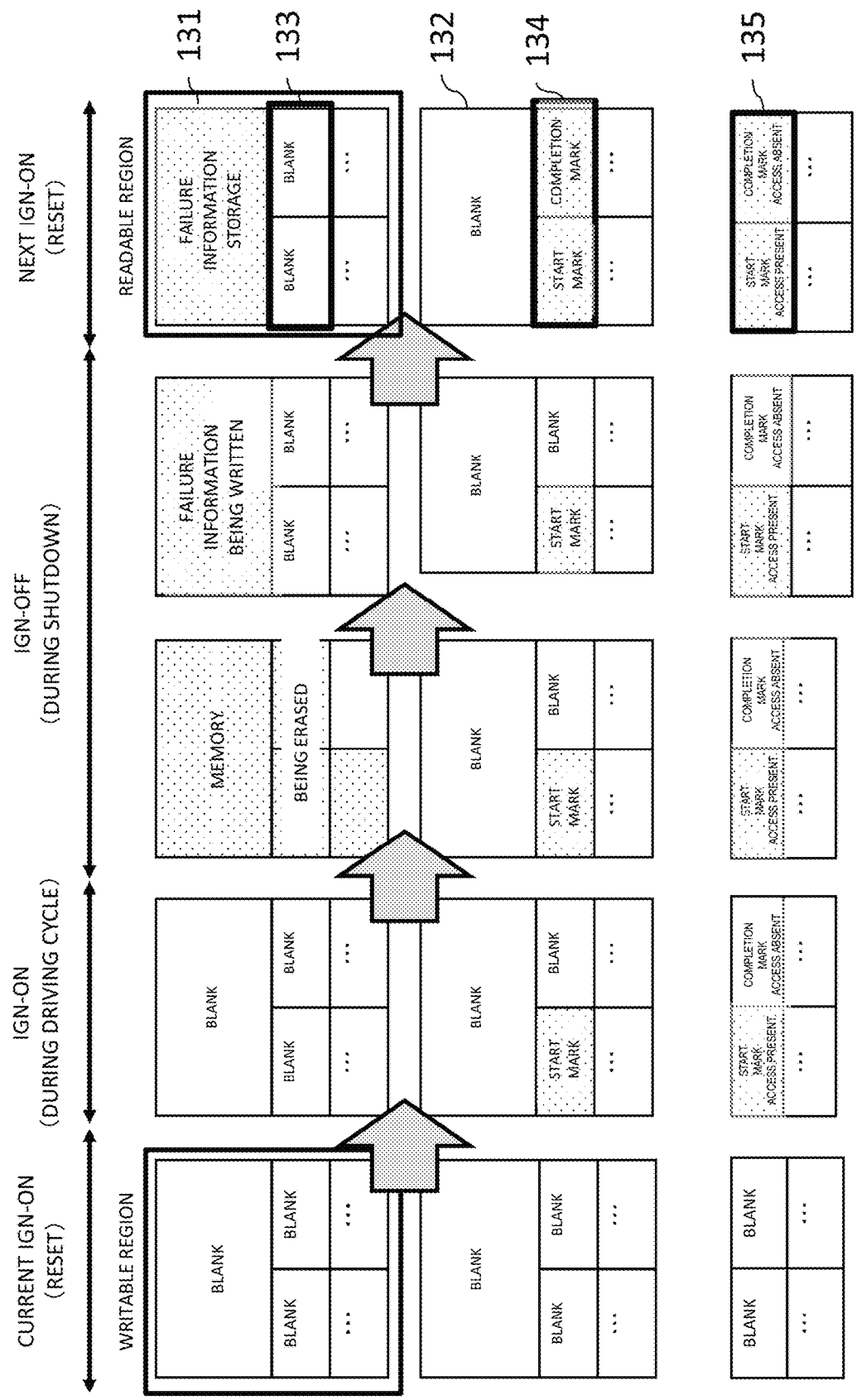
FIG. 4 is a diagram illustrating failure information writing processing at the time when no battery disconnection abnormality occurs in the electronic control device according to the embodiment.

FIG. 4 is a diagram illustrating failure information writing processing at the time when no battery disconnection abnormality occurs in the electronic control device according to the embodiment.

In FIG. 4, it is assumed that the failure information storage regions 131 and 132, the second storage region management information storage region 133, the first storage region management information storage region 134, and the management information access flag storage region 135 have been in a blank state at the time when the ignition switch is turned from OFF to ON. It is assumed that the failure information storage region 131 and the second storage region management information storage region 133 have been selected as writable regions.

Then, the driving cycle starts with the ignition switch being turned from OFF to ON as a trigger. Here, it is assumed that no battery disconnection abnormality occurs during the driving cycle and self-shutdown, and the memory backup control is normally performed.

At this time, during the driving cycle, the processor 110 writes the first storage region write start mark 134A to the first storage region management information storage region 134. Furthermore, on an assumption that there is an access to the first storage region management information storage region 134, the processor 110 writes the write start mark access flag 135A to the management information access flag storage region 135. Then, the processor 110 sequentially executes solenoid control, controller area network (CAN) communication control, and the like that are necessary for vehicle control.

Next, when the ignition switch is turned from ON to OFF during the driving cycle, the processor 110 executes self-shutdown. During the self-shutdown, the processor 110 erases the first storage region 31 in preparation for writing the failure information to the failure information storage region 131 in order to end the current driving cycle. In erasing the first storage region 31, the entire first storage region 31 is erased, and hence not only the failure information storage region 131 but also the second storage region management information storage region 133 are erased.

Upon completion of erasure of the first storage region 31, the processor 110 writes the failure information stored in the RAM 120 to the failure information storage region 131. Upon normal completion of writing of the failure information, the processor 110 writes the first storage region write completion mark 134B to the first storage region management information storage region 134. Furthermore, on an assumption that there is an access to the first storage region management information storage region 134, the processor 110 writes the write completion mark access flag 135B to the management information access flag storage region 135.

At this time, in the first storage region 31, the failure information storage region 131 stores the failure information during the driving cycle, and the second storage region management information storage region 133 is in the blank state because it has been erased before the failure information is written. In the second storage region 32, the first storage region management information storage region 134 stores the first storage region write start mark 134A and the first storage region write completion mark 134B. Accordingly, as a storage state of the management information, the first storage region write start mark 134A and the first storage region write completion mark 134B are stored as the management information of the first storage region 31, and the second storage region write start mark 133A and the second storage region write completion mark 133B become blank as the management information of the second storage region 32.

The management information access flag storage region 135 stores the write start mark access flag 135A and the write completion mark access flag 135B. This indicates that there has been an access to the first storage region management information storage region 134 in order to write the first storage region write start mark 134A and the first storage region write completion mark 134B to the first storage region management information storage region 134.

When the next driving cycle starts again with the ignition switch being turned from OFF to ON as a trigger, the processor 110 can determine, from record patterns of the second storage region management information storage region 133, the first storage region management information storage region 134, and the management information access flag storage region 135, that the writing of the failure information of the last driving cycle has been normally executed and that no battery disconnection abnormality has occurred either during the driving cycle or during the self-shutdown.

On the other hand, the record patterns of the second storage region management information storage region 133, the first storage region management information storage region 134, and the management information access flag storage region 135 of the flash memory 130 in the case where a battery disconnection abnormality has occurred are different from the record patterns of the second storage region management information storage region 133, the first storage region management information storage region 134, and the management information access flag storage region 135 of the flash memory 130 in the case where a battery disconnection abnormality has not occurred.

Hereinafter, failure information writing processing in a case where a battery disconnection abnormality has occurred during a driving cycle and failure information writing processing in a case where a battery disconnection abnormality has occurred during self-shutdown will be described.

Figure 5:
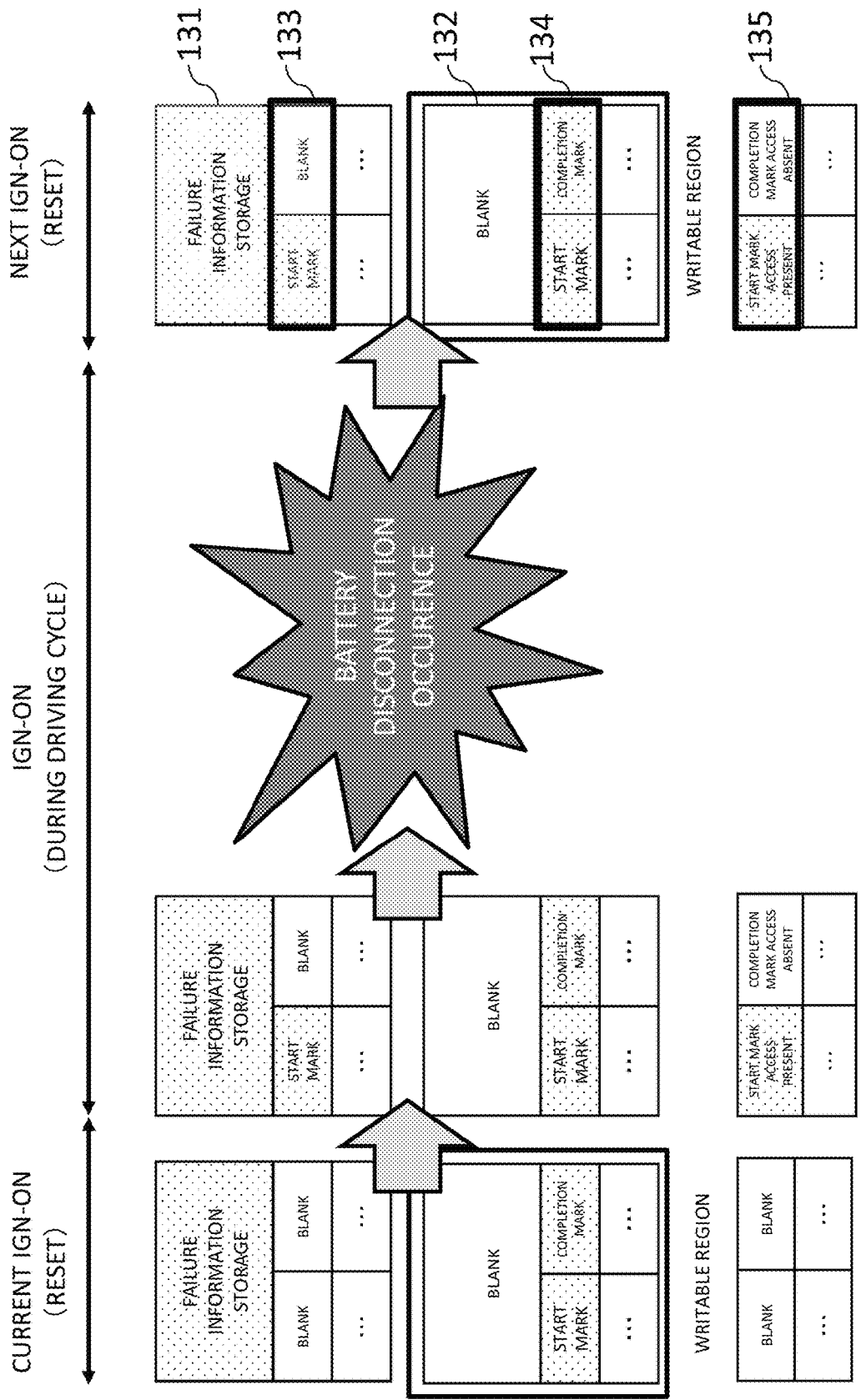
FIG. 5 is a diagram illustrating the failure information writing processing at the time when a battery disconnection abnormality has occurred during a driving cycle of the electronic control device according to the embodiment.

FIG. 5 is a diagram illustrating the failure information writing processing at the time when a battery disconnection abnormality has occurred during a driving cycle of the electronic control device according to the embodiment. FIG. 5 presents an example in which writing of the failure information of the first storage region 31 has been normally completed, and subsequently, writing of the failure information of the second storage region 32 has failed.

In FIG. 5, it is assumed that when the ignition switch is turned from OFF to ON, the failure information storage region 131 stores failure information, and the first storage region management information storage region 134 stores the first storage region write start mark 134A and the first storage region write completion mark 134B. Furthermore, it is assumed that the failure information storage region 132, the second storage region management information storage region 133, and the management information access flag storage region 135 have been in a blank state. Then, it is assumed that the failure information storage region 132 and the first storage region management information storage region 134 have been selected as writable regions.

Then, the driving cycle starts with the ignition switch being turned from OFF to ON as a trigger. During the driving cycle, the processor 110 writes the second storage region write start mark 133A to the second storage region management information storage region 133.

Furthermore, on an assumption that there is an access to the second storage region management information storage region 133, the processor 110 writes the write start mark access flag 135A to the management information access flag storage region 135. Then, the processor 110 sequentially executes solenoid control, CAN communication control, and the like that are necessary for vehicle control.

Here, when the battery 150, which is the power supply source to the electronic control device 100, becomes in a disconnection state, the current driving cycle ends without going through the self-shutdown processing. Therefore, the writing of the failure information to the failure information storage region 132, the writing of the second storage region write completion mark 133B to the second storage region management information storage region 133, and the writing of the write completion mark access flag 135B to the management information access flag storage region 135 are not performed.

Furthermore, since the second storage region 32 has not gone through the self-shutdown processing, the first storage region management information storage region 134 is not accessed from the outside. Therefore, the first storage region management information storage region 134 remains as the management information setting at the time of memory backup in the last driving cycle.

Accordingly, the record patterns of the second storage region management information storage region 133, the first storage region management information storage region 134, and the management information access flag storage region 135 are different from that in a case where no battery disconnection abnormality has occurred of FIG. 4, and only the second storage region write start mark 133A is stored in the first storage region 31, and the first storage region write start mark 134A and the first storage region write completion mark 134B are stored in the second storage region 32.

Therefore, when the next driving cycle starts again with the ignition switch being turned from OFF to ON as a trigger, the processor 110 can determine, from record patterns of the second storage region management information storage region 133, the first storage region management information storage region 134, and the management information access flag storage region 135, that an abnormality has occurred in the writing of the failure information of the last driving cycle and that a battery disconnection abnormality has occurred during the driving cycle.

Figure 6:
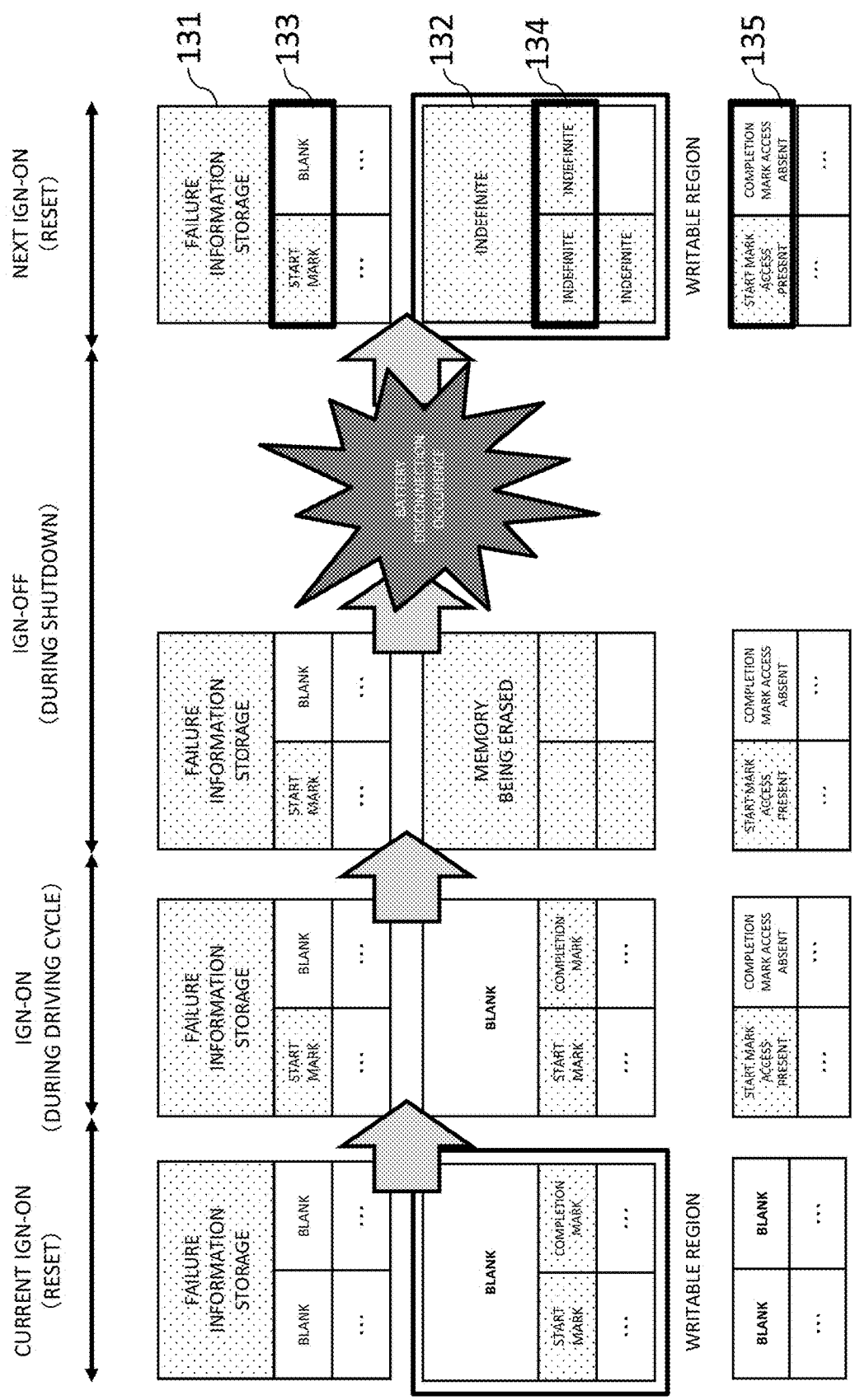
FIG. 6 is a diagram illustrating the failure information writing processing at the time when a battery disconnection abnormality has occurred during shutdown of the electronic control device according to the embodiment.

FIG. 6 is a diagram illustrating the failure information writing processing at the time when a battery disconnection abnormality has occurred during shutdown of the electronic control device according to the embodiment. FIG. 6 presents an example in which writing of the failure information of the first storage region 31 has been normally completed, and subsequently, writing of the failure information of the second storage region 32 has failed.

In FIG. 6, it is assumed that when the ignition switch is turned from OFF to ON, the failure information storage region 131 stores failure information, and the first storage region management information storage region 134 stores the first storage region write start mark 134A and the first storage region write completion mark 134B. Furthermore, it is assumed that the failure information storage region 132, the second storage region management information storage region 133, and the management information access flag storage region 135 have been in a blank state. Then, it is assumed that the failure information storage region 132 and the first storage region management information storage region 134 have been selected as writable regions.

Then, the driving cycle starts with the ignition switch being turned from OFF to ON as a trigger. During the driving cycle, the processor 110 writes the second storage region write start mark 133A to the second storage region management information storage region 133.

Furthermore, on an assumption that there is an access to the second storage region management information storage region 133, the processor 110 writes the write start mark access flag 135A to the management information access flag storage region 135. Then, the processor 110 sequentially executes solenoid control, CAN communication control, and the like that are necessary for vehicle control.

Next, when the ignition switch is turned from ON to OFF during the driving cycle, the processor 110 executes self-shutdown. During the self-shutdown, the processor 110 erases the second storage region 32 in preparation for writing the failure information to the failure information storage region 132 in order to end the current driving cycle. In erasing the second storage region 32, the entire second storage region 32 is erased, and hence not only the failure information storage region 132 but also the first storage region management information storage region 134 are erased.

Here, when the battery 150, which is the power supply source to the electronic control device 100, becomes in a disconnection state, the writing of the second storage region write completion mark 133B to the second storage region management information storage region 133 and the writing of the write completion mark access flag 135B to the management information access flag storage region 135 are not performed. Furthermore, as for the second storage region 32, the first storage region management information storage region 134 is accessed by memory erasing processing, and the battery disconnection occurs during the memory erasing, so that the storage data may become indefinite data.

Accordingly, the record patterns of the second storage region management information storage region 133, the first storage region management information storage region 134, and the management information access flag storage region 135 at the time when the battery disconnection abnormality has occurred during the self-shutdown are different from that in a case where a battery disconnection abnormality has occurred during the driving cycle of FIG. 5, and indefinite data which is neither blank setting, the first storage region write start mark 134A, nor the first storage region write completion mark 134B are stored in the second storage region 32.

Therefore, when the next driving cycle starts again with the ignition switch being turned from OFF to ON as a trigger, the processor 110 can determine, from record patterns of the second storage region management information storage region 133, the first storage region management information storage region 134, and the management information access flag storage region 135, that an abnormality has occurred in the writing of the failure information of the last driving cycle and that a battery disconnection abnormality has occurred during the self-shutdown.

Here, as illustrated in FIGS. 5 and 6, in a case where the battery disconnection abnormality has occurred either during the driving cycle or during the self-shutdown, the storage contents of the management information access flag storage region 135 become the write start mark access flag 135A that is present and the write completion mark access flag 135B that is absent. Therefore, even when an element abnormality in which the management information is not normally written to the first storage region 31 and the second storage region 32 occurs, it is possible to determine whether or not a battery disconnection abnormality has occurred during the driving cycle or the self-shutdown by referring to the storage contents of the management information access flag storage region 135. Therefore, even when the battery voltage sensor is not mounted, a battery abnormality during the driving cycle or during the self-shutdown can be detected without changing the hardware configuration and without requiring an enormous amount of man-hours for software development.

The detailed processing of the electronic control device 100 of FIG. 1 will be described below with reference to the flows of FIGS. 7 to 10. This processing performs, during the driving cycle, start mark writing and completion mark writing to the second storage region management information storage region 133 and the first storage region management information storage region 134, and further performs writing of the management information access flag of each to the management information access flag storage region 135. By diagnosing these three types of management information at the timing of switching to the next driving cycle, it is possible to correctly detect a memory backup abnormality at the time when necessary power is not supplied from the battery 150 to the electronic control device 100 due to a battery voltage drop or a battery disconnection.

Figure 7:
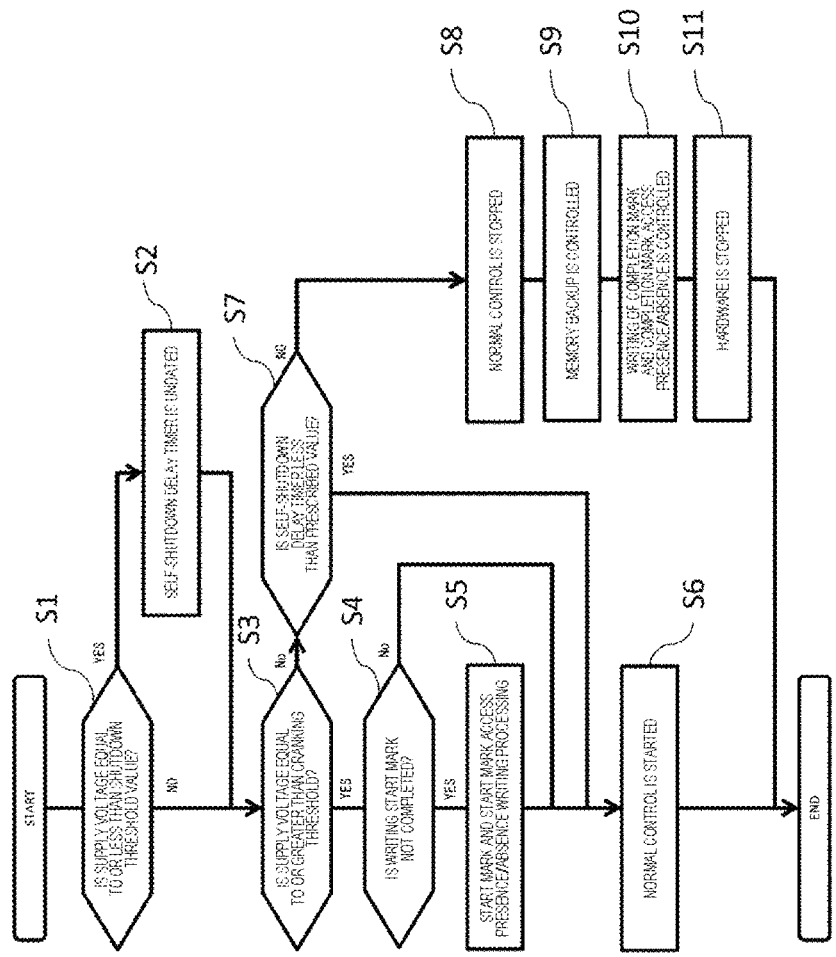
FIG. 7 is a flowchart illustrating control processing during the driving cycle of the electronic control device according to the embodiment.

FIG. 7 is a flowchart illustrating control processing during the driving cycle of the electronic control device according to the embodiment. The control processing during the driving cycle includes start mark writing, completion mark writing, and writing of the management information access flag of each. The start mark and the completion mark can be set to a predetermined constant. This processing is repeated at the earliest prescribed cycle after the RESET processing immediately after the start of the driving cycle.

In FIG. 7, the supply voltage supplied to the electronic control device 100 is monitored in step S1, and, depending on the state of the supply voltage, the control processing during the driving cycle and the control processing during the self-shutdown are switched.

That is, it is determined in step S1 whether the supply voltage is equal to or less than a shutdown threshold value.

If the supply voltage is not equal to or less than the shutdown threshold value, the flow of processing proceeds to control processing during the driving cycle. As control processing during the driving cycle, it is determined whether the supply voltage is equal to or greater than a cranking threshold value. If the supply voltage is equal to or greater than the cranking threshold value, it is determined that a voltage drop due to cranking at the time of starting the engine has not occurred and the supply voltage to the electronic control device 100 is in a stable state, i.e., during the driving cycle, and the flow of processing proceeds to step S4.

In step S4, it is determined whether the start mark writing is not completed. If the start mark writing is not completed, writing processing of the start mark and the management information access flag of the start mark side is executed in step S5. Next, in step S6, normal control such as automatic transmission control scheduled in advance by interruption of a prescribed cycle is started.

On the other hand, if the supply voltage is equal to or less than the shutdown threshold value, the flow of processing proceeds to the control processing during self-shutdown. As control processing during the self-shutdown, a delay timer for self-shutdown is updated in step S2. If the supply voltage is not equal to or greater than the cranking threshold value, it is determined in step S7 whether the value of the delay timer updated in step S2 is less than a prescribed value. If the value of the delay timer is less than the prescribed value, the flow of processing proceeds to step S6 to start the normal control. If the value of the delay timer is equal to or greater than the prescribed value, the ignition switch is turned off, and in step S8, the normal control performed during the driving cycle is stopped as the control processing during the self-shutdown. Next, in step S9, backup of the failure information updated during the driving cycle is performed. Then, writing processing of the completion mark and the management information access flag on the completion mark side is executed in step S10, and the hardware of an A/D converter or the like operated during the automatic transmission control is stopped in step S11.

Figure 8:
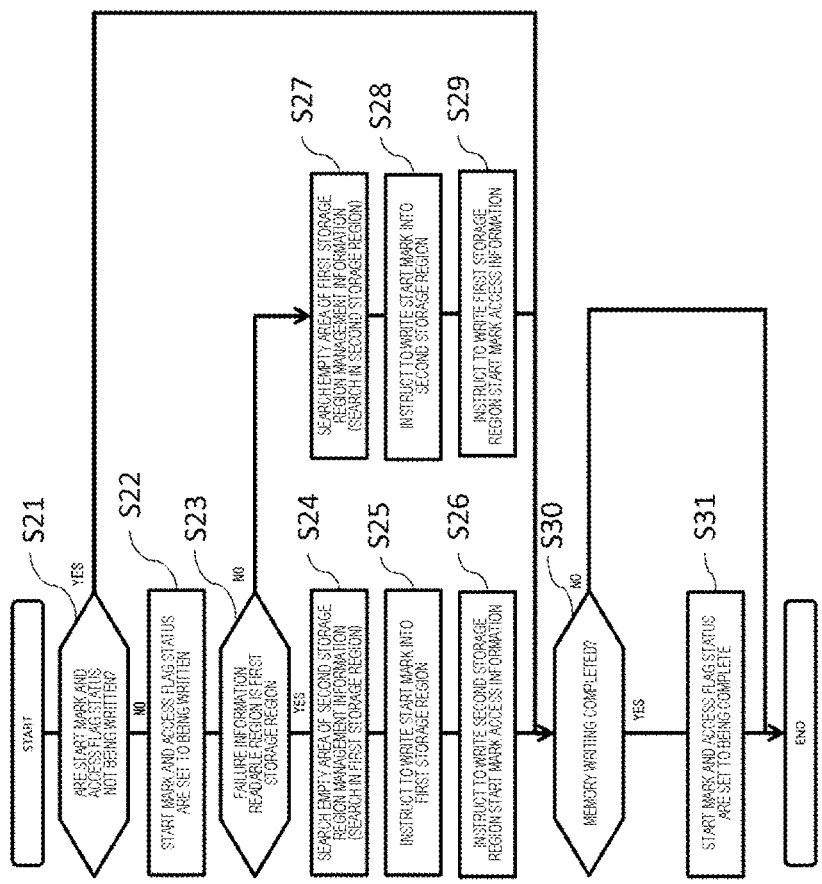
FIG. 8 is a flowchart illustrating write start mark writing processing of failure information according to the embodiment.

FIG. 8 is a flowchart illustrating write start mark writing processing of failure information of step S5 in FIG. 7 according to the embodiment.

In FIG. 8, in order not to instruct to write the start mark in steps S24 to S29 again in the cycle after starting the writing the start mark and the management information access flag, it is confirmed in step S21 that the processing status information of the start mark and the management information access flag is not being written. If the processing status information is being written, the flow of processing skips steps S24 to S29 and proceeds to step S30.

If the processing status information is not being written, the processing status information of the start mark and the management information access flag is set in step S22 to being written. Next, in step S23, it is determined whether the storage region in which the failure information during the current driving cycle can be read, which is generated by the memory backup read control at the time of RESET, is the first storage region 31 or the second storage region 32. If the readable storage region is the first storage region 31, an empty area of the second storage region management information storage region 133 in the first storage region 31 is searched in step S24 in preparation for writing the failure information to the second storage region 32. Then, the writing of the second storage region write start mark 133A to the empty area is started in step S25.

Next, in step S26, on an assumption that there is an access to the region of the second storage region write start mark 133A recorded in the second storage region management information storage region 133 in the first storage region 31, it is instructed to write the write start mark access flag 135A to the management information access flag storage region 135.

On the other hand, if it is determined in step S23 that the readable storage region is the second storage region 32, an empty area of the first storage region management information storage region 134 in the second storage region 32 is searched in step S27 in preparation for writing the failure information to the first storage region 31. Then, the writing of the first storage region write start mark 134A to the empty area is started in step S28.

Next, in step S29, on an assumption that there is an access to the region of the first storage region write start mark 134A recorded in the first storage region management information storage region 134 in the second storage region 32, it is instructed to write the write start mark access flag 135A to the management information access flag storage region 135.

Here, the reason for writing the start mark into the management information on the readable region side is to prevent the management information from being erased when writing the failure information during the self-shutdown and to prevent the determination of the management information from becoming impossible at the time start of the next driving cycle, even if the start mark is recorded in the management information on the writable region side.

Upon completion of the instruction of writing the start mark and the management information access flag of the start mark side in the above process, it is confirmed in step S30 whether the writing to the flash memory 130 has been completed. If the writing has been normally completed, the processing status information of the start mark and the management information access flag is updated in step S31.

The write completion mark writing processing is executed after the writing control of the failure information during the self-shutdown as information indicating that the memory backup has been normally completed. At this time, the area in which the completion mark is written is determined by the storage region in which the failure information during the current driving cycle can be read.

Figure 9:
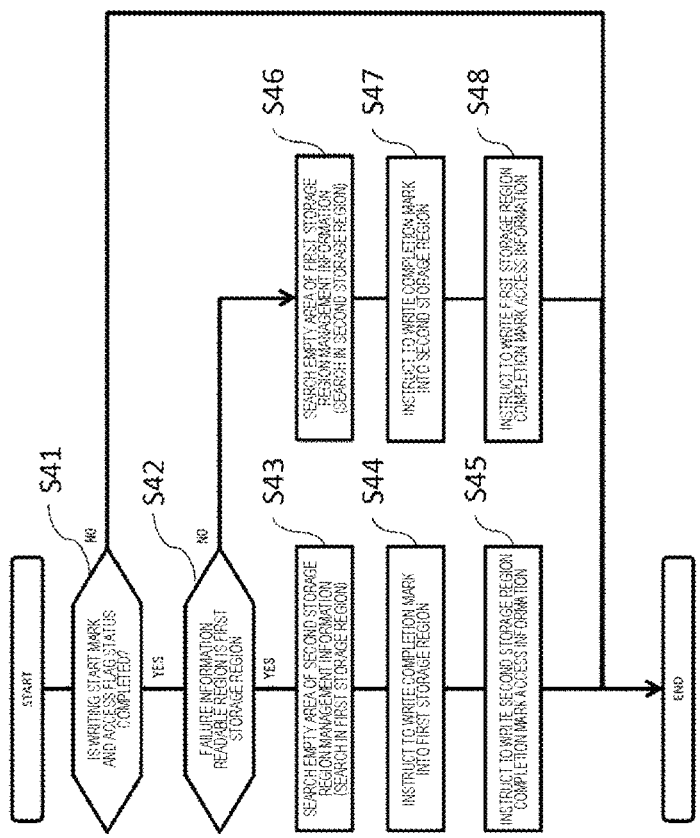
FIG. 9 is a flowchart illustrating write completion mark writing processing of failure information according to the embodiment.

FIG. 9 is a flowchart illustrating write completion mark writing processing of failure information of step S10 in FIG. 7 according to the embodiment.

In FIG. 9, in step S41, the processing status information of the current second storage region write start mark 133A or the first storage region write start mark 134A and the write start mark access flag 135A is read, and it is determined whether writing of the second storage region write start mark 133A or the first storage region write start mark 134A and the write start mark access flag 135A has been completed. If the writing has not been completed, steps S42 to S48 are skipped, and the processing ends.

If the writing has been completed, it is determined in step S42 whether the storage region in which the failure information during the current driving cycle can be read is the first storage region 31 or the second storage region 32. If the readable storage region is the first storage region 31, the storage region in which the failure information is written is the second storage region 32. Therefore, an empty area of the second storage region management information storage region 133 secured in the first storage region 31 is searched in step S43. Then, the second storage region write completion mark 133B is written in the empty area in step S44.

Next, in step S45, on an assumption that there is an access to the region of the second storage region write completion mark 133B recorded in the second storage region management information storage region 133 in the first storage region 31, it is instructed to write the write completion mark access flag 135B to the management information access flag storage region 135.

On the other hand, if it is determined in step S42 that the readable storage region is the first storage region 31, the storage region in which the failure information is written is the first storage region 31. Therefore, an empty area of the first storage region management information storage region 134 secured in the second storage region 32 is searched in step S46. Then, the first storage region write completion mark 134B is written in the empty area in step S47.

Next, in step S48, on an assumption that there is an access to the region of the first storage region write completion mark 134B recorded in the first storage region management information storage region 134 in the second storage region 32, it is instructed to write the write completion mark access flag 135B to the management information access flag storage region 135.

Figure 10:
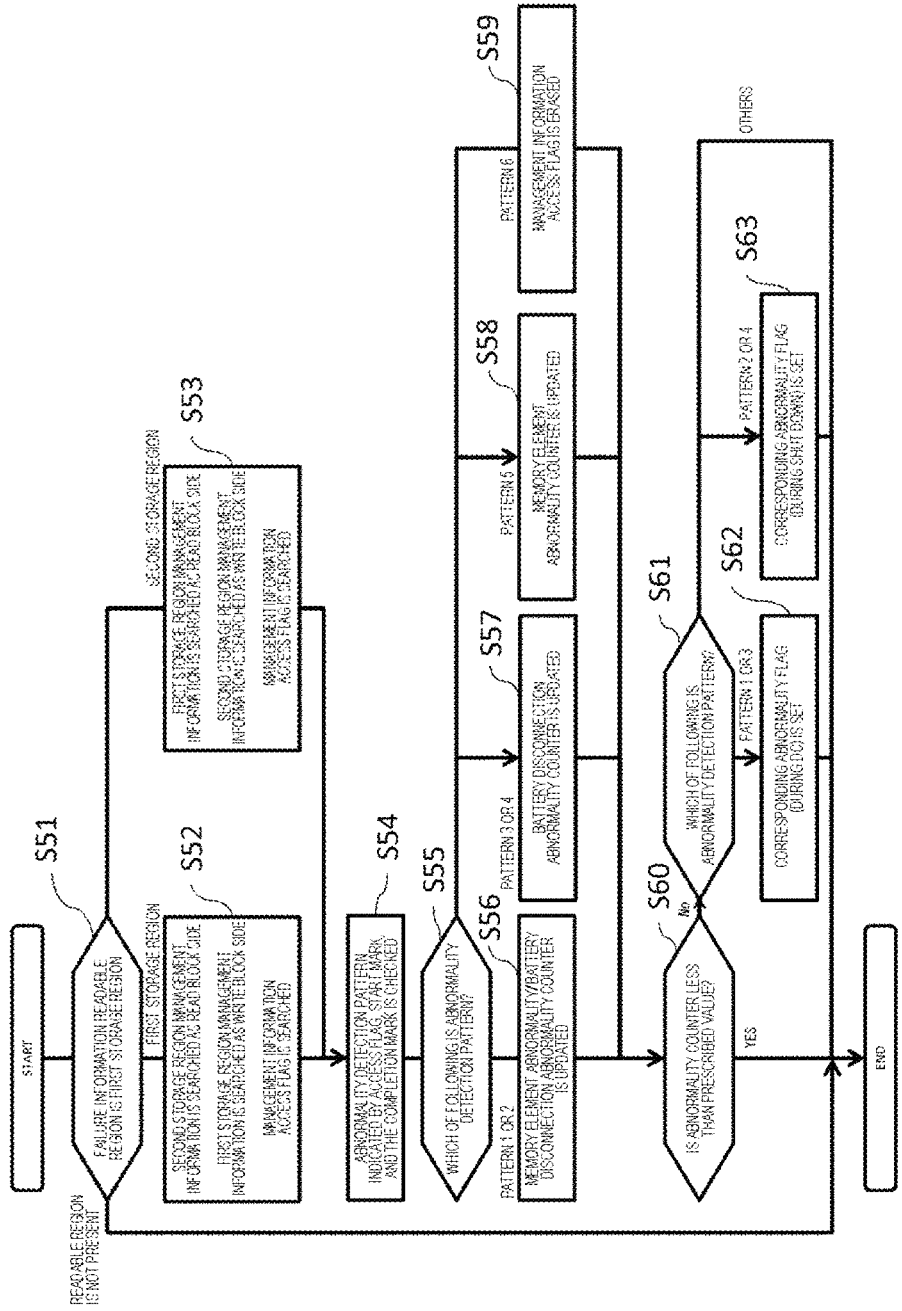
FIG. 10 is a flowchart illustrating battery disconnection abnormality determination processing of the electronic control device according to the embodiment.

FIG. 10 is a flowchart illustrating battery disconnection abnormality determination processing of the electronic control device according to the embodiment. The battery disconnection abnormality determination processing is executed at the timing when the driving cycle is switched, and on the basis of the storage pattern of the start mark, the completion mark, and the management information access flag at the time of starting the next driving cycle, it is diagnosed whether there has been a battery disconnection abnormality at the time of memory backup control of the last driving cycle.

In FIG. 10, it is determined in step S51 whether the storage region in which the failure information in the current driving cycle can be read is the first storage region 31 or the second storage region 32. If the readable storage region is the first storage region 31, in a step S52, the second storage region write start mark 133A and the second storage region write completion mark 133B, which are management information for the second storage region 32 secured in the first storage region 31 as the readable block side, are searched, the first storage region write start mark 134A and the first storage region write completion mark 134B, which are management information for the first storage region 31 secured in the second storage region 32 as the writable block side, are searched, and the write start mark access flag 135A and the write completion mark access flag 135B on the readable block side are searched.

If it is determined in step S51 that the readable storage region is the second storage region 32, on the other hand, in step S53, the first storage region write start mark 134A and the first storage region write completion mark 134B, which are the management information for the first storage region 31 secured in the second storage region 32 as the readable block side, are searched, the second storage region write start mark 133A and the second storage region write completion mark 133B, which are the management information for the second storage region 32 secured in the first storage region 31 as the writable block side, are searched, and the write start mark access flag 135A and the write completion mark access flag 135B on the readable block side are searched.

Upon completion of the search of the start mark, the completion mark, and the management information access flag in step S52 or step S53, the abnormality detection pattern indicated by the start mark, the completion mark, and the management information access flag is checked in step S54.

FIG. 11 is a table presenting an abnormality detection pattern of management information determination processing in the electronic control device according to the embodiment.

In FIG. 11, on the basis of a total of three elements of the management information of the failure information readable region, the management information of the failure information writable region, and the management information access flag, the abnormality detection pattern is classified into the following six types. At this time, the detection content of abnormality of the battery disconnection using the memory backup control can be set as follows.

In patterns 1 and 2, the result indicates that the start mark side of the management information access flag has an access and the completion mark side of the management information access flag has no access, thereby assuming that without going through the self-shutdown processing, the memory backup control has not been executed. Accordingly, in the current driving cycle, the failure information readable region has not been switched from the last driving cycle. As a result, from the storage pattern of the management information of the failure information readable region, a memory backup abnormality due to a battery disconnection abnormality and a memory element abnormality on the readable storage region side are suspected. Furthermore, this abnormal state can be further subdivided as follows by confirming the management information on the failure information writable region side.

If the battery disconnection occurs during the driving cycle, the management information on the failure information writable region side is not accessed from the outside. That is, as an assumed abnormality detection pattern, a blank setting in an initial state or a state in which management information at the time when the memory backup control has been normally completed in the last driving cycle is stored (start mark or completion mark) is conceivable.

On the other hand, if the battery disconnection occurs during the self-shutdown, the management information on the failure information writable region side is accessed in the memory erasing process at the time of the memory backup. In other words, as the assumed abnormality detection pattern, unlike the abnormality detection pattern during the driving cycle, the battery is disconnected during the memory erasure, and therefore it is conceivable that an indefinite setting (values other than the blank, the start mark, and the completion mark) is stored.

Therefore, in the pattern 1, it is possible to detect that the battery disconnection and the memory element abnormality have simultaneous occurred during the driving cycle. In the pattern 2, it is possible to detect that the battery disconnection and the memory element abnormality have simultaneous occurred during the self-shutdown.

In patterns 3 and 4, as in the patterns 1 and 2, the result indicates that the start mark side of the management information access flag has an access and the completion mark side of the management information access flag has no access, thereby assuming that without going through the self-shutdown processing, the memory backup control has not been executed. Accordingly, in the current driving cycle, the failure information readable region has not been switched from the last driving cycle. At this time, the storage patterns of the management information of the failure information readable region are different between the patterns 3 and 4 and the patterns 1 and 2. As a result, from the storage pattern of the management information of the failure information readable region, a memory backup abnormality due to a battery disconnection abnormality is suspected. Furthermore, by confirming the management information on the failure information writable region side, it is possible to subdivide whether to be the battery disconnection abnormality during the driving cycle or to be the battery disconnection abnormality during the self-shutdown.

In a pattern 5, the result indicates that the start mark side of the management information access flag has an access and the completion mark side of the management information access flag has an access, thereby assuming that the self-shutdown processing has been completed, the memory backup control has been executed. At this time, in the current driving cycle, the failure information readable region has been switched from the last driving cycle because the storage of the failure information has been updated. As a result, the management information secured in the readable storage region should be erased in the process of the memory backup control and set to blank, and the management information in the writable region should be set to the start mark and the completion mark in accordance with the contents of the management information access flag. A memory element abnormality on the writable storage region side is suspected from the storage pattern of the management information. However, since the memory element abnormality is an abnormality not from a point of view of a battery disconnection but from a point of view of a memory backup abnormality, the memory element abnormality detection is not performed here.

In a pattern 6, as in the pattern 5, the management information recorded in the readable storage region is set to blank. In the management information recorded in the writable storage region, the start mark and the completion mark are normally recorded in accordance with the content of the management information access flag. Therefore, from the record patterns of the three types of management information, it is conceivable that the memory backup control has been normally completed, and it can be regarded that no battery disconnection has occurred during the driving cycle.

In FIG. 10, upon completion of the check of the abnormality detection pattern in step S54, it is determined in step S55 which of the patterns 1 to 6 the abnormality detection pattern corresponds to. The flow of processing proceeds to step S56 if the abnormality detection pattern is the pattern 1 or 2, the flow of processing proceeds to step S57 if the abnormality detection pattern is the pattern 3 or 4, the flow of processing proceeds to step S58 if the abnormality detection pattern is the pattern 5, and the flow of processing proceeds to step S59 if the abnormality detection pattern is the pattern 6. Then, in steps S56 to S58, respective abnormality counters are updated in accordance with the abnormality detection patterns.

Since the validity of the first storage region 31 and the second storage region 32 has been confirmed in step S54 and the memory backup has been normally completed, the access flag of the management information is erased in step S59 for the battery disconnection abnormality diagnosis in the next driving cycle.

Here, for the patterns 1 to 5 among the abnormality detection patterns checked in step S54, switching of the failure information readable region is not performed in the next driving cycle on an assumption that the memory backup control has been abnormally ended. Therefore, as illustrated in FIG. 12, combinations of the start mark and the completion mark of the abnormal patterns and the presence or absence of the management information access flag are accumulated in the management information of the first storage region 31, the management information of the second storage region 32, and the management information access flag. If the accumulation value at this time becomes equal to or greater than a prescribed value, it is possible to determine what kind of battery disconnection abnormality has occurred in the last driving cycle.

FIG. 12 is a diagram illustrating the failure information writing processing at the time when a battery disconnection abnormality has continuously occurred during a driving cycle of the electronic control device according to the embodiment.

In FIG. 12, it is assumed that a battery disconnection abnormality has occurred during the last driving cycle. Then, it is assumed that when the ignition switch is turned from OFF to ON in the current driving cycle, the failure information storage region 131 stores failure information, the second storage region management information storage region 133 stores the second storage region write start mark 133A, the first storage region management information storage region 134 stores the first storage region write start mark 134A and the first storage region write completion mark 134B, and the management information access flag storage region 135 stores the write start mark access flag 135A. Then, it is assumed that the failure information storage region 132 and the first storage region management information storage region 134 have been selected as writable regions.

Then, the current driving cycle starts with the ignition switch being turned from OFF to ON as a trigger. During the current driving cycle, the processor 110 writes the secondary second storage region write start mark 133A to the second storage region management information storage region 133. Furthermore, on an assumption that there is an access to the second storage region management information storage region 133, the processor 110 writes the secondary write start mark access flag 135A to the management information access flag storage region 135. Then, the processor 110 sequentially executes solenoid control, CAN communication control, and the like that are necessary for vehicle control.

Here, when the battery 150, which is the power supply source to the electronic control device 100, becomes in a disconnection state again, the current driving cycle ends without going through the self-shutdown processing. Therefore, the writing of the failure information to the failure information storage region 132, the writing of the second storage region write completion mark 133B to the second storage region management information storage region 133, and the writing of the write completion mark access flag 135B to the management information access flag storage region 135 are not performed.

Furthermore, since the second storage region 32 has not gone through the self-shutdown processing, the first storage region management information storage region 134 is not accessed from the outside. Therefore, the first storage region management information storage region 134 remains as the management information setting at the time of memory backup in the last driving cycle.

Accordingly, the record patterns of the second storage region management information storage region 133 and the management information access flag storage region 135 are different from that in a case where the first battery disconnection abnormality has occurred of FIG. 5, and two second storage region write start marks 133A are stored in the second storage region management information storage region 133, and two write start mark access flags 135A are stored in the management information access flag storage region 135.

For this reason, in step S60 of FIG. 10, the abnormality counter count updated in steps S56 to S58 is compared with a prescribed value having been set in advance.

If the abnormality counter count is less than the prescribed value, the processing ends. If the abnormality counter count has reached equal to or greater than the prescribed value, it is determined which of the patterns 1 to 6 the abnormality detection pattern corresponds to. If the abnormality detection pattern is the pattern 1 or 3, the corresponding abnormality flag (battery disconnection timing is during driving cycle) is set. If the abnormality detection pattern is the pattern 2 or 4, the corresponding abnormality flag (battery disconnection timing is during shutdown) is set. If the abnormality detection pattern is any other pattern, the processing ends.

REFERENCE SIGNS LIST 100 vehicle electronic control device
110 CPU
120 RAM
130 flash memory
131, 132 failure information storage region
133 second storage region management information storage region
134 first storage region management information storage region
135 management information access flag storage region
140 bus

The invention claimed is:

1. An electronic control device, comprising a nonvolatile memory including a plurality of storage regions,
   wherein the storage regions include
      an information storage region for storing information, and
      a management information storage region for storing management information indicating a write state of information to the storage regions, and
   the nonvolatile memory includes, separately from the storage regions, a management information access flag storage region for storing access information indicating a presence or absence of an access to the management information,
   and further comprising a processor accessible to the nonvolatile memory,
   wherein the processor diagnoses a battery disconnection or a battery voltage drop abnormality in a last driving cycle or self-shutdown based on the management information and the access information at a time of start of a current driving cycle.

2. The electronic control device according to claim 1, wherein the storage region stores the management information with respect to information held in another of the storage regions.

3. The electronic control device according to claim 1, wherein the processor diagnoses the battery disconnection or the battery voltage drop abnormality in accordance with a record pattern of the management information and the access information.

4. The electronic control device according to claim 1, wherein
the storage regions include a first storage region and a second storage region,
the first storage region includes
a first information storage region for storing first information, and
a second storage region management information storage region for storing management information of second information stored in the second storage region, and
the second storage region includes
a second information storage region for storing second information, and
a first storage region management information storage region for storing management information of first information stored in the first storage region.

5. The electronic control device according to claim 4, wherein
when the second storage region is a readable region during a driving cycle,
the first storage region management information storage region holds a start mark indicating a write start of the information, and
the management information access flag storage region holds a start mark access flag indicating a presence or absence of an access to a registration address of the start mark, and
when the second storage region is a readable region during self-shutdown,
the first storage region management information storage region holds a completion mark indicating a write completion of the information, and
the management information access flag storage region holds a completion mark access flag indicating a presence or absence of an access to a registration address of the completion mark.

6. The electronic control device according to claim 5, comprising:
a volatile memory for storing the information; and
a processor accessible to the nonvolatile memory and the volatile memory,
wherein the processor, during the self-shutdown, erases data stored in the first storage region, and saves information stored in the volatile memory to the first information storage region.

7. The electronic control device according to claim 6, wherein the processor diagnoses a memory backup abnormality due to a battery disconnection abnormality and a memory element abnormality on a readable region side based on storage patterns of the first storage region management information storage region, the second storage region management information storage region, and the management information access flag storage region.

8. An electronic control device comprising a nonvolatile memory including a plurality of storage regions,
wherein the storage regions include
an information storage region for storing information, and
a management information storage region for storing management information indicating a write state of information to the storage regions, and
the nonvolatile memory includes, separately from the storage regions, a management information access flag storage region for storing access information indicating a presence or absence of an access to the management information, and wherein
during a driving cycle,
the management information storage region holds a start mark indicating a write start of the information, and
the management information access flag storage region holds a start mark access flag indicating a presence or absence of an access to a registration address of the start mark, and
during self-shutdown,
the management information storage region holds a completion mark indicating a write completion of the information, and
the management information access flag storage region holds a completion mark access flag indicating a presence or absence of an access to a registration address of the completion mark.

9. The electronic control device according to claim 8, wherein the start mark and the completion mark are set to a predetermined constant.

\* \* \* \* \*